United States Patent [19]

Hehl

[11] Patent Number: 4,598,336

[45] Date of Patent: Jul. 1, 1986

[54] INSERTION CODE ARRANGEMENT FOR INTERCHANGEABLE CIRCUIT BOARD MODULES

[76] Inventor: Karl Hehl, Arthur-Hehl-Strasse 32, 7298 Lossburg 1, Fed. Rep. of Germany

[21] Appl. No.: 538,750

[22] Filed: Oct. 3, 1983

[30] Foreign Application Priority Data

Oct. 2, 1982 [DE] Fed. Rep. of Germany ....... 3236603

[51] Int. Cl.⁴ .......................... H05K 7/14; H05K 5/04

[52] U.S. Cl. ...................................... 361/391; 211/41; 361/413; 361/415

[58] Field of Search .......................... 211/41; 312/223; 339/184 M, 184 T, 184 L, 184 R, 186 T, 186 M, 186 R; 361/390, 391, 394, 412, 413, 415

[56] References Cited

U.S. PATENT DOCUMENTS

| | | | |
|---|---|---|---|
| 2,871,457 | 1/1959 | Jencks et al. | 361/391 |
| 3,683,238 | 8/1972 | Olds et al. | 361/390 |
| 3,729,657 | 4/1973 | Callan et al. | 361/391 |
| 3,848,953 | 11/1974 | Petroshanoff | 361/391 |
| 4,439,809 | 3/1984 | Weight et al. | 361/413 |

*Primary Examiner*—A. D. Pellinen
*Assistant Examiner*—Gregory D. Thompson
*Attorney, Agent, or Firm*—Joseph A. Geiger

[57] ABSTRACT

An insertion code arrangement for a bank of interchangeable circuit board modules in an electronic circuitry cabinet featuring a set of numbered pairs of code plates with permanently arranged code elements in the form of an integral code prong on each male code plate and a matching code slot on each female code plate, the male plates being snap-attachable to the contact edge of a circuit board module between upper and lower contact bars, and the female plates being clamped to the inside of the back panel of the circuitry cabinet. The laterally offset arrangement of the code elements on the code plates doubles the number of code patterns available from two identical sets of code plates, when one set of plates is rotated 180°.

14 Claims, 15 Drawing Figures

INSERTION CODE ARRANGEMENT FOR INTERCHANGEABLE CIRCUIT BOARD MODULES

BACKGROUND OF THE INVENTION

1. Field of the Invention

The present invention relates to the structure of electronic circuitry cabinets and, more particularly, to the arrangement of a plurality of interchangeable circuit board modules in a circuitry cabinet and to the positive prevention of erroneous insertion of a circuit board module through use of mechanically cooperating code elements.

2. Description of the Prior Art

The widespread use of printed circuit boards in conjunction with the miniaturization of electronic circuitry components has made it possible to arrange the majority of electronic control components directly on the surface of the printed circuit boards and, in the case of extensive circuitry requirements, to arrange a number of interchangeable printed circuit board modules within a circuitry cabinet from which each module can be readily withdrawn for servicing access or replacement.

Interchangeable circuit board modules are normally so arranged that the insertion of a module automatically establishes multi-conductor contact between it and the other circuit board modules through a data bus, for example, or between the circuit board module and a multi-pin plug connector at the end of a cable.

An electronic circuitry cabinet may contain a considerable number of outwardly identical circuit board modules which are supported in parallel insertion guides along which each module can be individually inserted and retracted. Obviously, the insertion of a circuit board module into a module slot other than the one for which it was designed will not only lead to malfunction of the control center, but, more often than not, will cause damage to some of the electronic control components on the module. The damage may be of the kind which is not immediately evident.

The desire to preclude the possibility of an electronic control center being powered-on with a circuit board module inserted in the wrong slot of its circuitry cabinet has already led to various suggestions aimed at signaling the insertion error and/or preventing powering-on, or at physically preventing the insertion—at least the complete insertion—of a circuit board module.

One prior art solution is disclosed in the German Offenlegungsschrift (Published Application) No. 31 00 393 which suggests the attachment of an insertion verification clip to the outer edge of each of a bank of circuit board modules in such a way that the verification clips are vertically staggered in a regular pattern and the clip of each module establishes electrical contact with the higher clip of an adjacent module on one side and the lower clip of an adjacent module on the other side. This arrangement provides an identification of each module through the vertical location of its clip. The chain of electrical contacts can be used to produce a warning signal and/or to prevent powering-on.

A major shortcoming of this arrangement lies in the fact that the higher one of two adjoining clips blocks the retraction movement of the lower one, with the result that the circuit board modules can only be inserted and removed in a predetermined sequence.

Another solution is disclosed in the German Gebrauchsmuster (Utility Patent) No. 75 32 854. This publication suggests the arrangement of insertion-preventing code elements on each circuit board module and on its associated stationary contact bar in the circuitry cabinet. The code elements take the form of comb-shaped members with teeth and tooth gaps engaging each other. The distinct code patterns on the various circuit board modules are produced by snap-inserting one or more code clips into selected tooth gaps of initially identical code members which are attached to the contact edge of the circuit board modules, and by breaking off one or more teeth of initially identical stationary code members in the module segments of the circuitry cabinet in places which correspond to the places where the circuit board modules carry inserted code clips.

Among the disadvantages of this solution are its complexity in terms of parts and assembly skills required and the risk of accidental destruction of the code pattern through breakage of a stationary tooth, when an attempt is made to insert a circuit board module into the wrong slot in the circuitry cabinet. The production of the distinct code patterns requires the manual modification of initially identical code members in the course of the assembly operation or in the field, when a circuit board module has to be replaced.

SUMMARY OF THE INVENTION

Underlying the present invention is the primary objective of suggesting an improved insertion-preventing code arrangement for use in conjunction with a bank of interchangeable printed circuit board modules in an electronic circuitry cabinet, under avoidance of the above-mentioned prior art shortcomings, which code elements are of simple low-cost design, easy to install and reliable in operation.

The present invention proposes to attain this objective by suggesting an insertion code arrangement for a bank of interchangeable circuit board modules in an electronic circuitry cabinet, wherein the code elements are matching pairs of male and female code plates with permanently established distinct code patterns in the form a an integral code prong on each male code plate and a cooperating code slot on each female code plate arranged in different locations from plate pair to plate pair.

In a preferred embodiment of the invention, the male and female code plates have matching rectangular outlines, fitting vertically between the upper and lower multi-conductor contact assemblies of the circuit board modules and the back panel of the circuitry cabinet. The male code plates are equipped with flexible retaining hooks near their longitudinal extremities with which they engage the proximate end portions of the upper and lower socket bars, after being snapped into position. The female code plates are attached to the inner side of the cabinet back panel by the same screws which normally clamp positioning frames for multipin plug connectors to the outer side of the back panel.

The cooperating code prongs and code slots of a set of male and female code plates are rectangular in outline and arranged progressively further from one extremity and closer to the other. The preferred embodiment further suggests the arrangement of the code prongs and code slots on their respective male and female code plates in a location which is laterally offset from the vertical center plane of the plates, thereby doubling the number of distinct insertion codes available, when two identical sets of code plates are used and one set is rotated 180°.

By way of a further improvement, the preferred embodiment also suggests the arrangement of a set of plate pairs in a "tree" configuration, with code prongs and code slots aligned in a progressive pattern of numbered positions, for the simultaneous molding of complete sets of male and female code plates in a single injection molding die and for storage and assembly of the plate pairs as complete sets.

The present invention offers a positive insertion-preventing code arrangement for a modular electronic control center. The provision of complete sets of numbered, permanently patterned pairs of code plates in the form of simple plate trees which are produced, stored and assembled as sets, eliminates the previous need, at the time of assembly, for manually establishing the code pattern on initially identical code members having a full set of code elements, through the addition of one or more code elements to one member and the removal of corresponding code elements from the other.

BRIEF DESCRIPTION OF THE DRAWINGS

Further special features and advantages of the invention will become apparent from the description following below, when taken together with the accompanying drawings which illustrate, by way of example, a preferred embodiment of the invention represented in the various figures as follows.

DESCRIPTION OF THE PREFERRED EMBODIMENT

Figure 1:
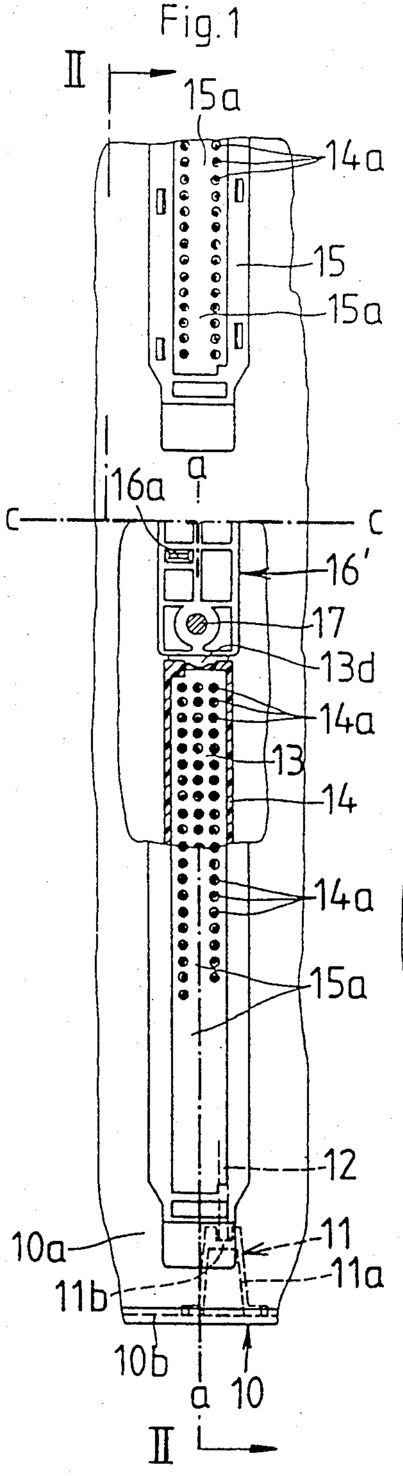
FIG. 1 shows, in an elevational view taken from behind the circuitry cabinet, portions of the back panel of the cabinet and of a circuit board module carrying a code plate, as part of an arrangement embodying the present invention.
Figure 2:
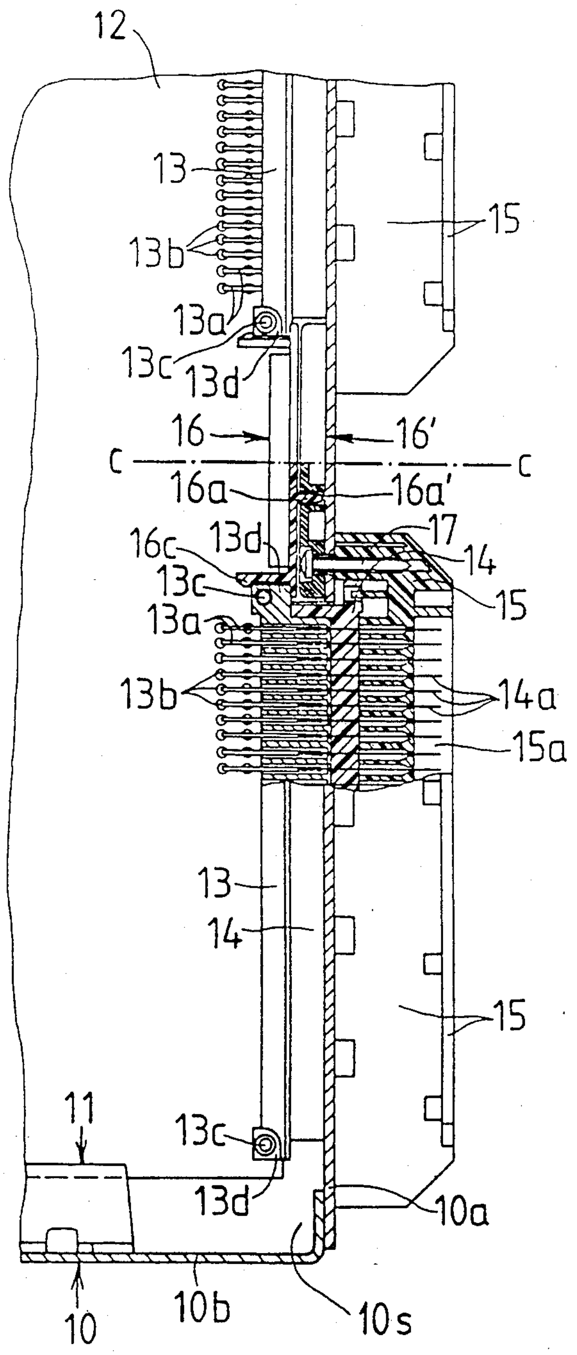
FIG. 2 shows the arrangement of FIG. 1 in a vertical longitudinal center section taken along line II—II the code plates being shown in the engaged position.
Figures 3, 3A, 3B:
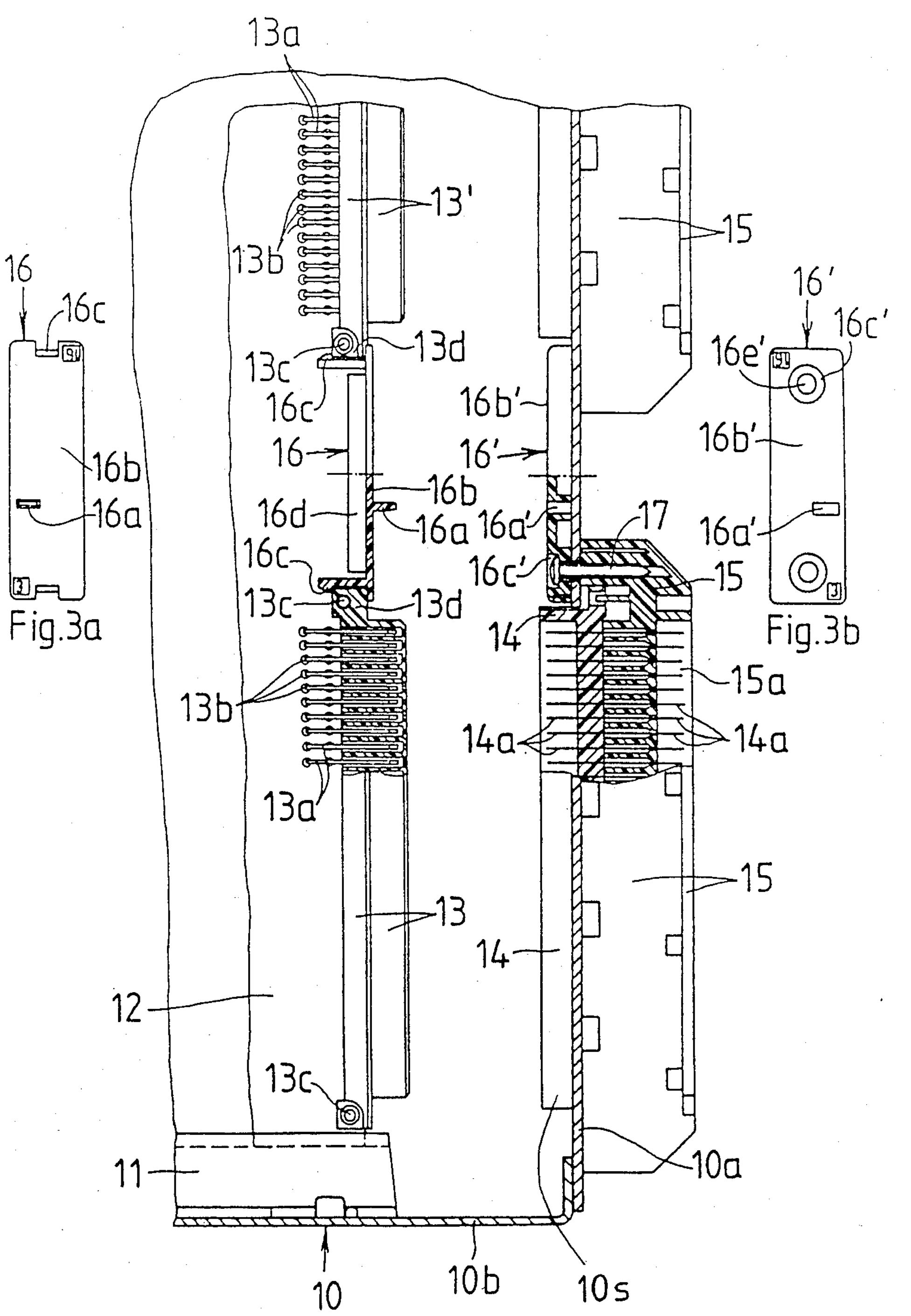
FIG. 3 is similar to FIG. 2, showing the circuit board module and its male code plate in a partially retracted position.
FIG. 3*a* shows the male code plate of FIG. 3 in a corresponding plan view.
FIG. 3*b* shows the female code plate of FIG. 3 in a similar plan view.

In FIGS. 1 through 3 of the drawings, a preferred embodiment of the the novel insertion code arrangement of the invention is illustrated in connection with a circuitry cabinet 10 of an electronic control center. The latter may be part of a computer-controlled production machine, such as, for example, a modern injection molding machine.

The circuitry cabinet 10, of FIG. 1 comprises a number of generally identical fixed module segments 10s holding an equal number of interchangeable circuit board modules 12 of identical, generally rectangular outline. The drawing shows only a single module segment 10s of the circuit cabinet 10 and a single circuit board module 12 in association therewith. The circuit board modules 12 are arranged at a regular lateral spacing, their lateral position being determined by two banks of insertion guide rails 11. Only one lower guide rail 11 on the bottom panel 10*b* of the cabinet 10 is shown in the drawing.

The rear vertical edges of the circuit board modules 12 serve as their contact edges. Each module 12 has two multiconductor contact bars in the form of an upper and a lower socket bar 13 attached to its contact edge by means of fasteners 13*c*. Each socket bar 13 has two rows of angled solder pins 13*a* electrically connected to the printed circuits of the circuit board module 12 by means of appropriate solder connections 13*b*. In the position shown in FIG. 2, the contact sockets of the upper and lower socket bars 13 are engaged by the contact pins 14*a* of aligned upper and lower stationary contact bars, or pin bars 14.

The stationary pin bars 14 reach to the inside of the back panel 10*a* through rectangular apertures in the latter, being held in place by plastic positioning frames 15. The positioning frames 15, in turn, are clamped to the outer side of the back panel 10*a* of the circuitry cabinet 10 by means of two screws 17 each. Rectangular recesses 15*a* in the positioning frames 15 surround the rearwardly extending portions of the contact pins 14*a*.

The stationary pin bars 14 are engageable by the socket bars of matching connectors (not shown). The pin bars 14 on the lower half of the circuitry cabinet 10 may be engaged by the plug connectors of various multi-conductor cables leading from the circuitry cabinet 10 to distant control points of the production machine, for example. The pin bars 14 on the upper half of the circuitry cabinet 10 may be engaged by a data bus (not shown) which interconnects all the circuit board modules 12. C Associated with each circuit board module 12 is a pair of plastic code plates 16 and 16' (plate pair K in FIGS. 12 and 13). As can be seen in FIG. 3, the male code plate 16 is attached to the vertical contact edge of the circuit board module 12, and the female code plate 16' is attached to the back panel 10*a* of the circuitry cabinet 10. The male code plate 16 carries a rearwardly protruding integral code prong 16*a* which is horizontally aligned with a matching code slot 16*a*' of the female code plate 16'.

As will be described in more detail further below, the code pattern distinguishing each circuit board module 12 from all other modules is realized in the specific vertical and lateral location of the code prong 16*a* and cooperating code slot 16*a*' of the each pair of code plates 16 and 16'.

In the vertical sense, the code plates 16 and 16' are arranged in the plane c-c, at mid-height of the circuitry cabinet 10, between the upper and lower rows of socket bars 13 and pin bars 14. Both code plates can be removed, if necessary. While the male code plate 16 is attached to the contact edge of the circuit board module 12 by means of a snap connection, the female code plate 16' is clamped to the inner side of the back panel 10*a* of the cabinet 10 by means of two screws.

Figure 4:
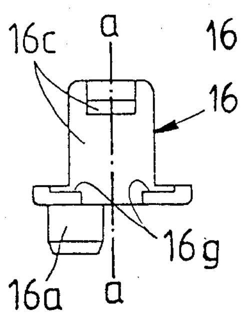
FIGS. 4 through 7 show, at an enlarged scale, the male code plate in, respectively, an end view, a top plan view, a bottom plan view and an elevational view.
Figure 5:
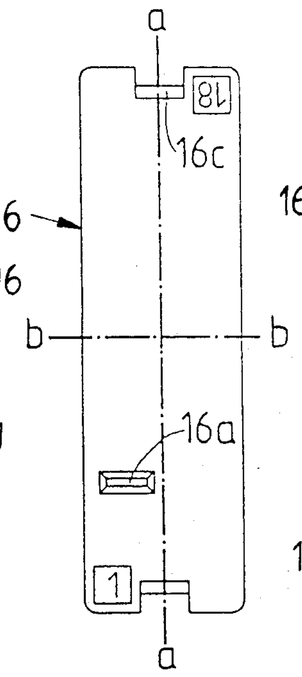
Figure 6:
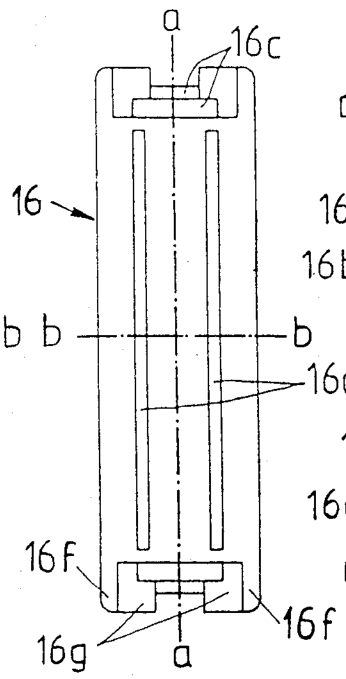

For this purpose, the male code plate 16 has a pair of longitudinally outwardly facing flexible retaining hooks 16*c* extending transversely from a point near its extremities. The noses of these hooks are engageable with an inwardly facing surface of the proximate attachment eyes 13*d* of the upper and lower socket bars 13 (FIG. 3). Recessed centering faces 16*g* at the extremities of the male code plate 16 (FIGS. 4 and 6) bear against an outwardly facing surface of the attachment eyes 13*d*, while shoulder portions 16*f* (FIG. 6) at the four corners of the plate 16 cooperate with the longitudinal edges of the two socket bars 13 to provide a centering action.

The female code plate 16' is attached to the inner side of the back panel 10*a*, in alignment with the male code plate 16 of the circuit board module 12 and vertically between the stationary pin bars 14. This attachment is accomplished by using two of the four screws 17 which clamp the upper and lower positioning frames 15 of each module segment to the outer side of the back panel 10*a*. (Only one of these screws is shown in FIGS. 2 and 3).

The screws 17 which attach the positioning frames 15 reach from the inside of the back panel 10*a* into tap bores of the frames 15. The two proximate screws 17, which also clamp the female code plate 16', are received in countersunk recesses 16*c'* of the plate 16', so that they need not be longer than the other two screws. The thickness of the female code plate 16' is approximately equal to the length of the code prong 16*a* of the male code plate 16, for a compact configuration. The female code plates 16' fit vertically between the inwardly protruding upper and lower stationary pin bars 14.

The two code plates 16 and 16', shown at an enlarged scale in FIGS. 4 through 11, have matching rectangular outlines. Their top surfaces 16*b* and 16*b'* are flat and in nearcontact in the fully engaged position of the circuit board module 12 (FIG. 2). It should be understood that the contact plates 16 and 16' could also be arranged to abut against each other in this position to form an insertion stop.

The male contact plate 16 has on its underside two longitudinal reinforcing ribs 16*d*, the ribs stopping short of the transversely extending retaining hooks 16*c* to provide flexibility for the latter. The female code plate 16' has on its underside a rib pattern 16*d'* consisting of a central longitudinal rib and four transverse ribs bordered by a matching peripheral flange, so as to define five pairs of compartments of which the end compartments are occupied by the countersunk recesses 16*c'* and the screw bores 16*e'*.

Figure 13:
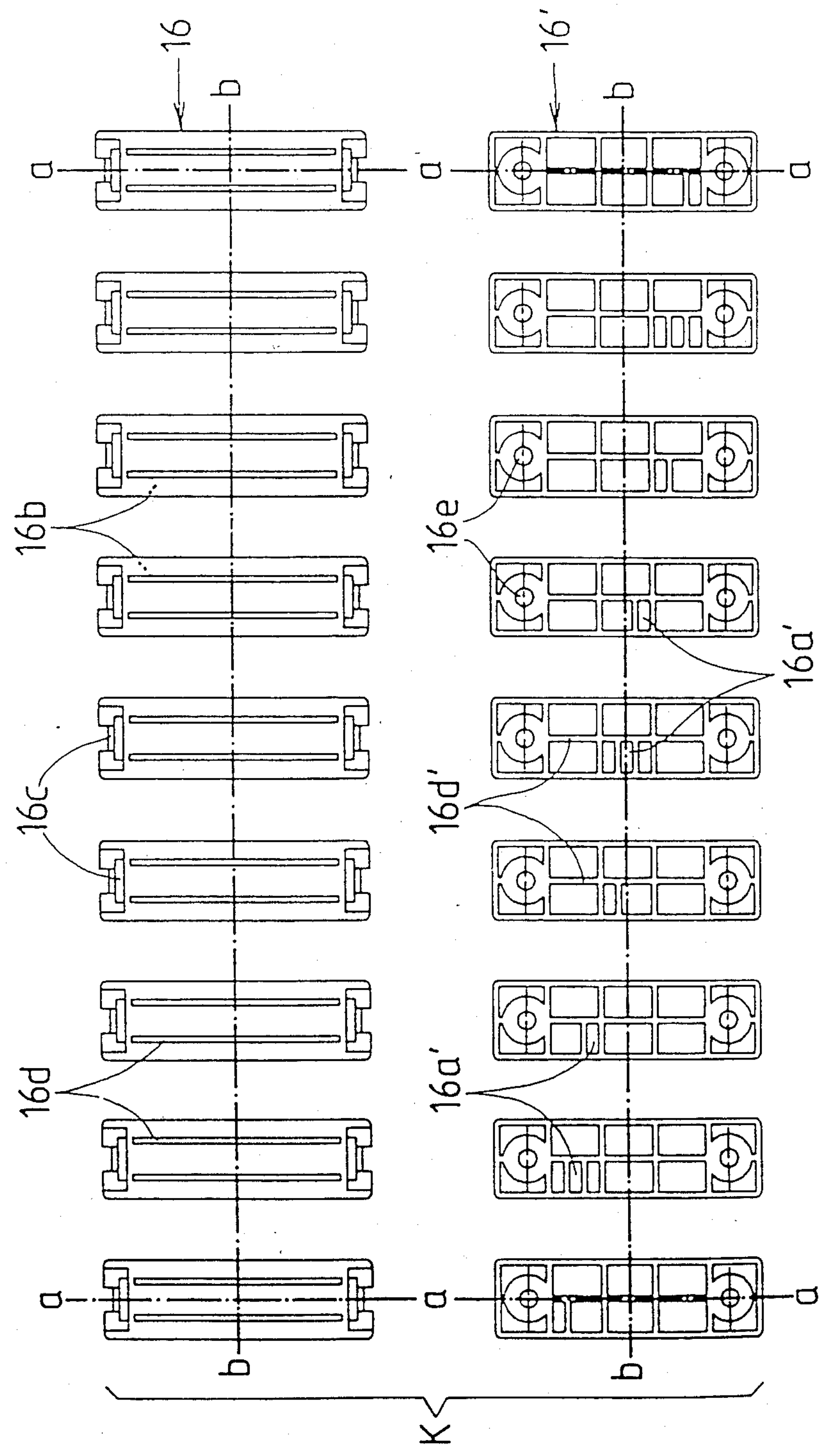
FIG. 13 shows the set of code plates of FIG. 12 in a corresponding bottom plan view.

The compartments defined by the rib pattern 16*d'* are so arranged that a code slot 16*a'* can have one of three different positions within each compartment, in a progression of regularly spaced slot positions, for a total of nine different slot positions, as can best be seen in the lower half of FIG. 13. The length of the rectangular code slot 16*a'* is delimited by the space between the central longitudinal rib and the peripheral flange. The longitudinal sides of the code slot are reinforced by transverse ribs, where they are not already bordered by a transverse rib of the basic rib pattern.

Figure 7:
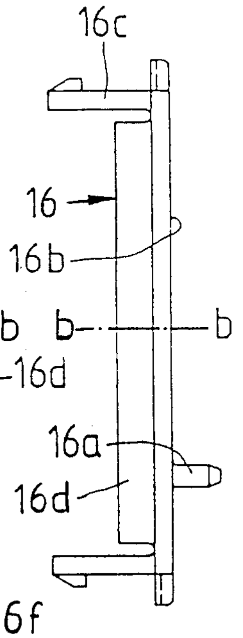
Figure 8:
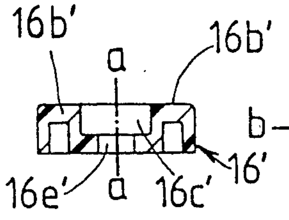
FIGS. 8 through 11 show, at an enlarged scale, the female code plate in, respectively, an end view, a top plan view, a bottom plan view and an elevational view.
Figure 9:
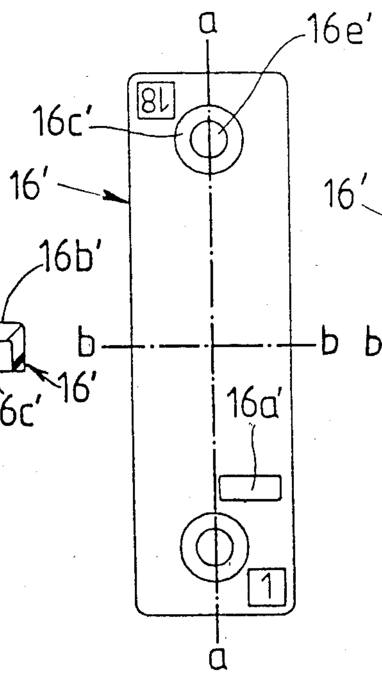
Figure 10:
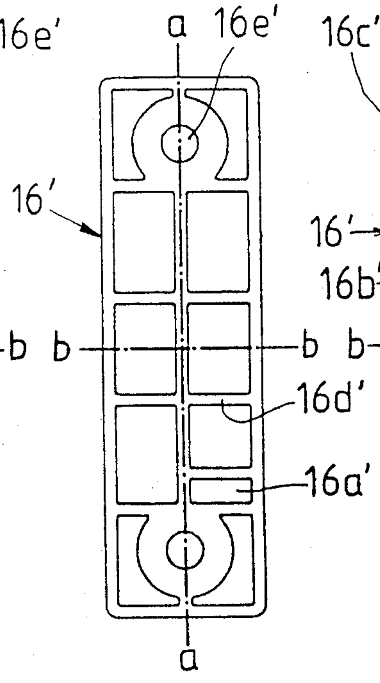
Figure 11:
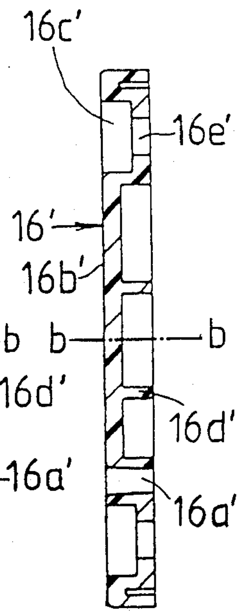

The code prong 16*a* extends perpendicularly from the top surface 16*b* of the male code plate 16, having a cross section matching that of the code slot 16*a'* and appropriate entry chamfers at its extremity (FIG. 7.).

Since it is necessary, due to the lateral offset of the socket bars 13 at the contact edges of the circuit board modules 12, and due to the arrangement of the electronic control components on only one side of the printed circuit boards, to physically prevent the accidental insertion of a circuit board module 12 in an upside-down orientation, it is possible to double the number of code patterns available, by arranging the code elements, i.e. the code prongs 16*a* and the code slots 16*a'*, at a lateral offset from the longitudinal center plane a-a of the code plates 16 and 16' and by rotating one set of code plates 180°.

Figure 12:
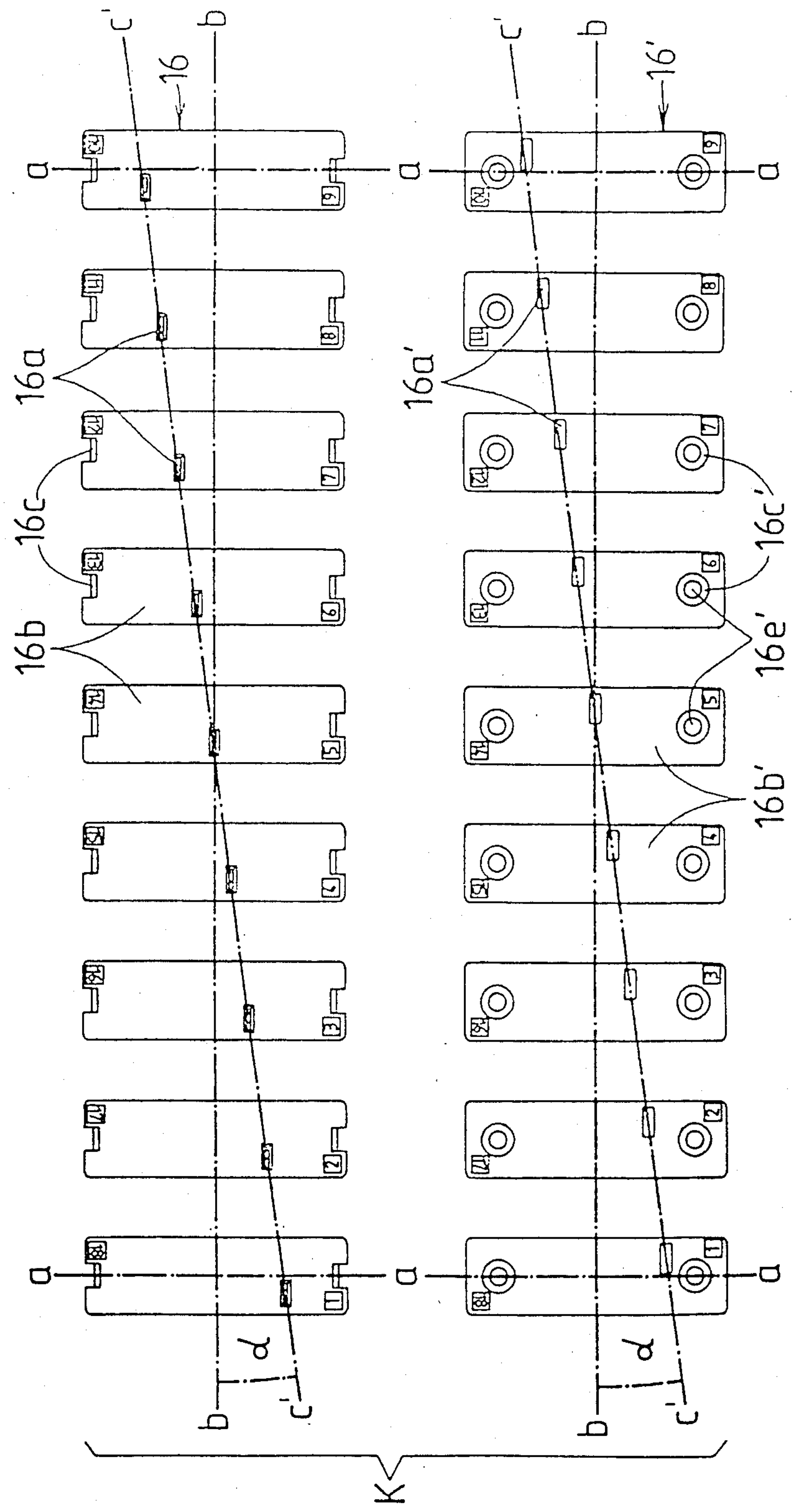
FIG. 12 shows a set of nine matching male and female code plates in a top plan view.

Accordingly, the nine different pairs of code plates of FIGS. 12 and 13 determine eighteen distinct insertion codes, for a circuitry cabinet 10 holding up to eighteen different circuit board modules 12. FIG. 12 shows the nine pairs of code plates in a layout in which the different positions of the code elements form a regular progression along an inclined line c'-c' on both the male code plates 16 and the female code plates 16'.

Conveniently, the nine plate pairs are injection-molded simultaneously, in a "tree" configuration corresponding to the layout shown in FIG. 12, the necessary removable connecting members, spures, etc. being not shown. The tool layout can be further simplified by arranging the plate pairs in the "tree" in such a way that the top sides 16*b* of the male code plates 16 are aligned with the top sides 16*b'* of the female code plates 16'. The resultant cost savings are obvious.

The regular progression of code prongs 16*a* along the inclined line c'-c' in the layout in FIG. 12 is the same as can be seen on the male code plates 16, when they are mounted on the contact edges of a bank of nine circuit board modules 12, and a corresponding progression pattern is present on the attached female code plates 16', when seen from inside the back panel 10*a* of the circuitry cabinet 10.

The lateral offset of the insertion guide rails 11 from the vertical center line a-a of the socket bars 13 and pin bars 14 can be seen in FIG. 1. The guide rail 11 has the cross-sectional profile of an inverted channel, with slightly tapering leg portions 11*a* and a crown portion 11*b* forming a central longitudinal guide groove. In the guide groove is received the bottom edge of the printed circuit board around which each circuit board module 12 is built. The male and female code plates 16 and 16' are preferably aligned with the contacts bars 13 and 14 at the vertical center line a-a.

It may not always be necessary for every circuit board module 12 to have two multi-conductor socket bars 13 attached to its contact edge. When only one socket bar 13 is required for a module, it may be desirable to attach in the place of the other socket bar 13 a dummy socket bar 13' (FIG. 3), to permit the snap-on attachment of the male code plate 16. An empty positing frame 15, or one holding a matching stationary dummy contact bar may be attached to the back panel 10*a*. Leaving out the "innards" of these dummy contact bars makes it possible to pass special cables and other lines through the resultant openings.

When produced in the suggested "tree"-sets of nine plate pairs, the code arrangement of the invention reduces the need for assembly skills to a minimum. Two plate trees provide all the code elements for a circuitry cabinet 10 of eighteen module segments in the correct progression. And, unlike the prior art coding elements described at the outset, the novel code plates with permanent code structure do not necessitate the manual creation of a number of distinct code patterns from initially identical codable parts, by snapping on and breaking off code elements in selected locations, with the attendant risk of error.

The suggestion of code plate pairs with a permanent code not only makes it possible to give the plates an extremely simple structure, it also makes it possible to provide a preset numerical identification of the particular code pattern on each plate, as can be seen in FIG. 12. Such an identification further simplifies the assembly task, when the module segments of the circuitry cabinet 10 and the corresponding circuit board modules 12 are marked with the same numbers.

In the event an attempt is made to insert a circuit board module 12 in the wrong position, the male code plate 16, by abutting against the top surface of the female code plate 16', will positively prevent engagement between the contact bars 13 and 14. If, in spite of the resistance offered by the non-matching code plates, an attempt is made to force such an insertion, the male code plate 16, rather than having its code prong 16a broken off, will deflect in the manner of a resilient beam, pushing the circuit board module 12 back out.

It should be understood, of course, that the foregoing disclosure describes only a preferred embodiment of the invention and that it is intended to cover all changes and modifications of this example of the invention which fall within the scope of the appended claims.

I claim the following:

1. In an electronic circuitry cabinet which defines a plurality of fixed module segments designed to hold a like number of circuit board modules of substantially equal size in a parallel side-by-side arrangement, and in which the circuit board modules are guided for insertion and removal along insertion guide means in the module segments of the circuitry cabinet, the leading edge of each circuit board module being a contact edge carrying at least one multi-conductor contact bar which, in the normal inserted position of the circuit board module, is engaged by a matching stationary multi-conductor contact bar in the associated module segment of the circuitry cabinet; in such a circuitry cabinet, an insertion code arrangement for the positive prevention of the accidental insertion and connection of a circuit board module in any other than its associated module segment, the insertion code arrangement comprising in combination:

a set of distinct pairs of cooperating male and female code members, each distinct pair being assigned to a circuit board module and its associated module segment in the circuitry cabinet;

a code protrusion arranged on each male code member in a location distinguishing it from all other male code members of the set; and a matching code recess arranged on each female code member in a location corresponding to that of the code protrusion of the associated male code member; and wherein one member of each distinct code member pair is removably attached to, and supported by, a circuit board module;

the other member of said pair is removable attached to and supported in a stationary position by the associated module segment of the circuitry cabinet; and the male and female members of each distinct code member pair are permanently coded through the arrangement of their matching code protrusions and code recesses as integral parts of their structure.

2. An insertion code arrangement as defined in claim 1, wherein the circuit board modules and the module segments in the circuitry cabinet define means for preventing the insertion of the circuit board modules in any other than their normal orientation;

the male and female members of each distinct pair of code members are reorientable as a pair and selectively attachable to their respective supports in one or two orientations 180° apart, having a reorientation axis which is parallel to the direction of module insertion; and the location of the matching code protrusions and code recesses of said code member pairs in relation to said reorientation axis is such that each pair defines a different distinct code pattern for a circuit board module and its module segment, when attached thereto in a 180°-rotated orientation.

3. An insertion code arrangement as defined in claim 1, wherein one member of each distinct pair of code members is attached to the contact edge of one of the circuit board modules;

the circuitry cabinet includes a back panel facing the contact edges of the circuit board modules; and the other member of each distinct pair of code members is attached to the back panel in the associated module segment.

4. An insertion code arrangement as defined in claim 1, wherein each circuit board module has arranged on its contact edge two contact bars which adjoin a midportion of the contact edge from opposite sides; and one member of each distinct pair of code members is attached to the contact edge of a circuit board module in said midportion and positioned by the two contact bars.

5. An insertion code arrangement as defined in claim 4, wherein the code members which are attached to the contact edges of the circuit board modules have the shape of generally rectangular plates, their longitudinal extremities engaging the proximate extremities of the two contact bars on their leading side, in the sense of module insertion; and said code members include flexible retaining hooks extending perpendicularly from the plates, near their longitudinal extremities, and engaging said contact bar extremities from the opposite side, whereby the code members are attachable to the contact edges in a snap-action operation.

6. An insertion code arrangement as defined in claim 5, wherein the matching code protrusions and code recesses of the code member pairs are located longitudinally between the locations of said retaining hooks; and said code members which are attached to the contact edges of the circuit board modules are resiliently flexible in the direction of module insertion, so that, when a circuit board module is inserted into the wrong module segment of the circuitry cabinet and the code protrusion and code recess of the code plates on the circuit board module and in the module segment do not match, the plate-shaped member on the contact edge of the circuit board module yields under resilient deflection, applying an opposing spring force to the wrongly inserted circuit board module.

7. An insertion code arrangement as defined in claim 4, wherein at least one circuit board module has arranged on its contact edge, in the place of one of the two contact bars, an outwardly similarly sized dummy bar to the proximate extremity of which said code member is attached.

8. An insertion code arrangement as defined in claim 1, wherein the male and female code members are male and female code plates of generally rectangular outline, their longitudinal axes being substantially parallel to the contact edges of the associated circuit board modules;

the male code plates are attached to the contact edges of the circuit board modules; and the female code plates are stationary and attached to the circuitry cabinet.

9. An insertion code arrangement as defined in claim 8, wherein the male code plates are removably attached to the contact edges of the circuit board modules;

the male code plates and the circuit board modules define means for attaching the code plate in a snap-action engagement;

the circuitry cabinet includes a pack panel facing the contact edges of the circuit board modules; and the female code plates are attached to the inner side of said back panel.

10. An insertion code arrangement as defined in claim 8, wherein each circuit board module has arranged on its contact edge two contact bars which adjoin a midportion of the contact edge from opposite sides;

the longitudinal extremities of the male code plates engage the proximate extremities of the two contact bars on their leading side, in the sense of module insertion; and the male code plates include flexible retaining hooks extending perpendicularly from their bottom surfaces, near their longitudinal extremities, and engaging said contact bar extremities from the opposite side, whereby the code plates are attachable to the contact edges in a snap-action operation.

11. An insertion code arrangement as defined in claim 1, wherein the male and female code members are male and female code plates of generally rectangular outline, their longitudinal axes being substantially parallel to the contact edges of the associated circuit board modules;

the male and female code plates have substantially flat top surfaces;

the code protrusion of the male code plates are in the form of code prongs extending perpendicularly from the top surface of the code plates, and the code recesses of the female code plates are in the form of matching openings in the top surface of the female code plates; and the male and female code plates of each plate pair are attached to their respective circuit board module and module segment in the circuitry cabinet in such a way that their top surfaces are perpendicular to the direction of module insertion and face each other at a minimal distance in the normal position of the circuit board module.

12. An insertion code arrangement as defined in claim 11, wherein the code prongs of the male code plates and the code recesses of the female code plates have an elongated cross section which is oriented transversely to the longitudinal axes of the male and female code plates; and the difference between code plate pairs, within said set of distinct paris, resides in a distinct longitudinal location of each pair of code prongs and code recesses on the top surfaces of their respective male and female code plates.

13. An insertion code arrangement as defined in claim 12, wherein the circuit board modules and the module segments in the circuitry cabinet define means for preventing the insertion of the circuit board modules in any other than their normal orientation;

the male and female code plates of each distinct pair of code plates are reorientable as a pair and selectively attachable to their respective supports in one of two orientations 180° apart, having a reorientation axis which is parallel to the direction of module insertion and intersects the longitudinal axes of the code plates perpendicularly; and the code prongs and code recesses on the top surfaces of the set of distinct pairs of code plates are located at a lateral distance from the longitudinal axes of the male and female code plates, so that each distinct plate pair defines a different distinct code pattern for a circuit board module and its module segment, when attached thereto in a 180°-rotated orientation.

14. An insertion code arrangement as defined in claim 1, wherein the male and female code members are male and female code plates of generally rectangular outline, their longitudinal axes being substantially parallel to the contact edges of the associated circuit board modules.

* * * * *